US012669552B2

(12) United States Patent
Yoshitake et al.

(10) Patent No.: US 12,669,552 B2
(45) Date of Patent: Jun. 30, 2026

(54) DIAGNOSTIC DEVICE, DIAGNOSTIC METHOD, AND NON-TRANSITORY COMPUTER-READABLE RECORDING MEDIUM STORING DIAGNOSTIC INSTRUCTIONS

(71) Applicant: YOKOGAWA ELECTRIC CORPORATION, Tokyo (JP)

(72) Inventors: Satoshi Yoshitake, Tokyo (JP); Hiroshi Akahori, Tokyo (JP); Masahiro Kazumi, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 519 days.

(21) Appl. No.: 17/953,845

(22) Filed: Sep. 27, 2022

(65) Prior Publication Data

US 2023/0093809 A1     Mar. 30, 2023

(30) Foreign Application Priority Data

Sep. 30, 2021    (JP) ................................. 2021-161867

(51) Int. Cl.
*G01R 31/392* (2019.01)
*G01R 31/3842* (2019.01)
*G01R 31/396* (2019.01)

(52) U.S. Cl.
CPC ....... *G01R 31/392* (2019.01); *G01R 31/3842* (2019.01); *G01R 31/396* (2019.01)

(58) Field of Classification Search
CPC .............. G01R 31/392; G01R 31/3842; G01R 31/396; G01R 31/3828; Y02E 60/10
See application file for complete search history.

(56) References Cited

U.S. PATENT DOCUMENTS

2015/0260798 A1* 9/2015 Sugiyama .......... G01R 31/3648
                                                    702/63
2016/0116547 A1* 4/2016 Hanyu ................. G01R 31/367
                                                    320/134

(Continued)

FOREIGN PATENT DOCUMENTS

CN          107064805 A          8/2017
JP          2016-085166 A        5/2016

(Continued)

OTHER PUBLICATIONS

Notice of Reasons for Refusal issued in corresponding Japanese Patent Application No. 2024-006268, mailed Sep. 3, 2024, with translation (4 pages).

(Continued)

*Primary Examiner* — Eman A Alkafawi
*Assistant Examiner* — Dilara Sultana
(74) *Attorney, Agent, or Firm* — Osha Bergman Watanabe & Burton LLP

(57) ABSTRACT

A diagnostic device includes: a calculator that calculates a value related to a capacity of a battery cell based on a result of comparison between a measurement Q-V curve and a reference Q-V curve, the measurement Q-V curve indicating a relation between a voltage and an integrated current amount that are obtained from measurement data of the battery cell. The calculator further calculates at least one of: an amount of capacity deterioration caused by a voltage difference between the measurement Q-V curve and the reference Q-V curve by multiplying an inclination of the measurement Q-V curve by the voltage difference, and a temporary maximum capacity after capacity deterioration caused by a change in the inclination of the measurement Q-V curve to an inclination of the reference Q-V curve.

10 Claims, 9 Drawing Sheets

(56) References Cited

U.S. PATENT DOCUMENTS

| | | | |
|---|---|---|---|
| 2016/0254687 A1* | 9/2016 | Tanaka ................ | H01M 10/425 |
| | | | 320/112 |
| 2017/0082694 A1* | 3/2017 | Yonemoto ........... | H01M 10/486 |
| 2017/0115355 A1* | 4/2017 | Willard .............. | G01R 31/3648 |
| 2017/0212170 A1* | 7/2017 | Torai ................... | H01M 10/482 |
| 2018/0261893 A1* | 9/2018 | Fujita .................. | G01R 31/392 |
| 2019/0113577 A1* | 4/2019 | Severson ........... | G01R 31/3842 |
| 2020/0271727 A1 | 8/2020 | Bae et al. | |
| 2020/0366115 A1* | 11/2020 | Kim ................... | H01M 10/425 |

FOREIGN PATENT DOCUMENTS

| | | | |
|---|---|---|---|
| JP | 2016126891 A | 7/2016 | |
| JP | 2016-145795 A | 8/2016 | |
| JP | 2017-227539 A | 12/2017 | |
| JP | 2020-532272 A | 11/2020 | |
| JP | 2021-500700 A | 1/2021 | |
| WO | 2016135913 A1 | 9/2016 | |

OTHER PUBLICATIONS

Notice of Reasons for Refusal issued in corresponding Japanese Patent Application No. 2024-006268, mailed Jan. 21, 2025, with translation (5 pages).

Office Action issued in corresponding Chinese Patent Application No. 202211201502.1, dated Dec. 12, 2025, with translation (16 pages).

* cited by examiner

FIG.5

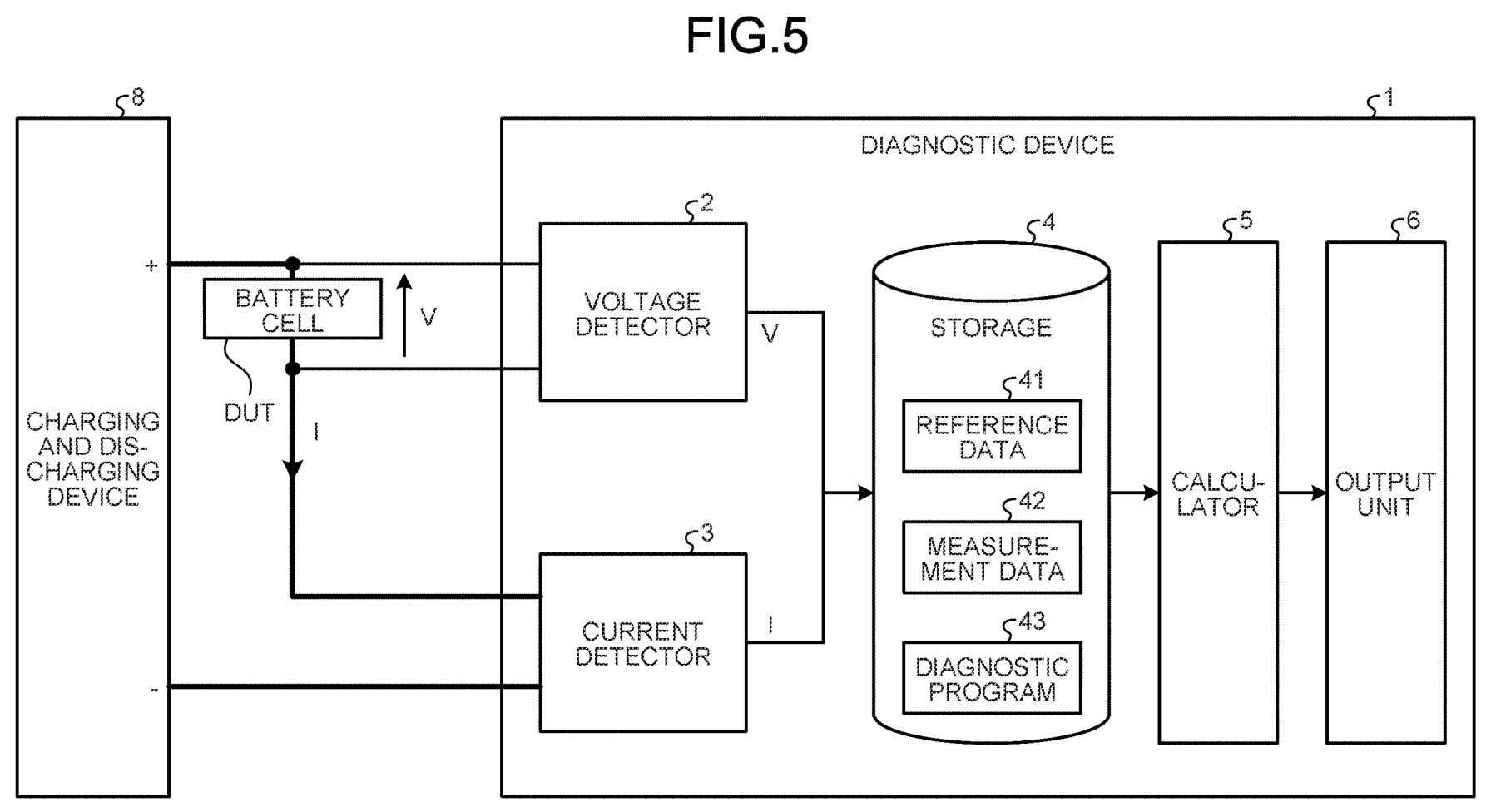

DIAGNOSTIC DEVICE 1

OUTPUT UNIT 6

CALCU-LATOR 5

STORAGE 4

REFERENCE DATA 41

MEASURE-MENT DATA 42

DIAGNOSTIC PROGRAM 43

VOLTAGE DETECTOR 2

CURRENT DETECTOR 3

V

I

BATTERY CELL

DUT

V

I

CHARGING AND DIS-CHARGING DEVICE 8

+

−

1

DIAGNOSTIC DEVICE, DIAGNOSTIC METHOD, AND NON-TRANSITORY COMPUTER-READABLE RECORDING MEDIUM STORING DIAGNOSTIC INSTRUCTIONS

CROSS-REFERENCE TO RELATED APPLICATIONS

The present application claims priority from Japanese Patent Application No. 2021-161867 filed in Japan on Sep. 30, 2021, the contents of which are incorporated herein by reference in their entirety.

BACKGROUND

Technical Field

The present invention relates to a diagnostic device, a diagnostic method, and a non-transitory computer-readable recording medium storing diagnostic instructions.

Description of the Related Art

Various methods for diagnosing the capacity of a battery cell have been proposed (e.g., see JP 2016-145795 A).

Those that indicates the characteristics of a battery cell include a Q-V curve indicating the relation between a voltage and an integrated current amount. There remains room for considering a method of diagnosing the capacity of the battery cell from the Q-V curve.

SUMMARY

One or more embodiments can diagnose the capacity of a battery cell from the Q-V curve.

According to one or more embodiments, a diagnostic device includes a calculator that calculates a value related to a capacity of a battery cell based on a result of comparison between a measurement Q-V curve and a reference Q-V curve, the measurement Q-V curve indicating relation between a voltage and an integrated current amount, which are obtained from measurement data of the battery cell, wherein the calculator includes at least one of: a first calculator that calculates an amount of capacity deterioration caused by a voltage difference between the measurement Q-V curve and the reference Q-V curve by multiplying an inclination of the measurement Q-V curve by the voltage difference; or a second calculator that calculates a temporary maximum capacity after capacity deterioration caused by a change in the inclination of the measurement Q-V curve to an inclination of the reference Q-V curve by multiplying a ratio between the inclination of the measurement Q-V curve and the inclination of the reference Q-V curve by a reference maximum capacity.

According to one or more embodiments, a diagnostic device includes a calculator that calculates a value related to a capacity of a battery cell by using a function model approximating a Q-V curve indicating relation between a voltage and an integrated current amount of the battery cell, wherein the calculator includes: a function model generator that generates a function model fitted to a reference Q-V curve; a fitting unit that fits the function model generated by the function model generator to measurement data of the battery cell; and a maximum capacity calculator that calculates a maximum capacity of the battery cell by using a function model after fitting performed by the fitting unit.

According to one or more embodiments, a diagnostic method includes calculating a value related to a capacity of a battery cell based on a result of comparison between a measurement Q-V curve and a reference Q-V curve, the measurement Q-V curve indicating relation between a voltage and an integrated current amount, which are obtained from measurement data of the battery cell, wherein the calculating includes at least one of: calculating an amount of capacity deterioration caused by a voltage difference between the measurement Q-V curve and the reference Q-V curve by multiplying an inclination of the measurement Q-V curve by the voltage difference; or calculating a temporary maximum capacity after capacity deterioration caused by a change in the inclination of the measurement Q-V curve to an inclination of the reference Q-V curve by multiplying a ratio between the inclination of the measurement Q-V curve and the inclination of the reference Q-V curve by a reference maximum capacity.

According to one or more embodiments, a diagnostic method includes calculating a value related to a capacity of a battery cell by using a function model approximating a Q-V curve indicating relation between a voltage and an integrated current amount of the battery cell, wherein the calculating includes: generating a function model fitted to a reference Q-V curve; fitting the function model that has been generated to measurement data of the battery cell; and calculating a maximum capacity of the battery cell by using a function model after fitting.

According to one or more embodiments, a non-transitory computer-readable recording medium stores therein diagnostic instructions that cause a computer to execute processing of calculating a value related to a capacity of a battery cell based on a result of comparison between a measurement Q-V curve and a reference Q-V curve, the measurement Q-V curve indicating relation between a voltage and an integrated current amount, which are obtained from measurement data of the battery cell, wherein processing of the calculating includes at least one of pieces of processing: calculating an amount of capacity deterioration caused by a voltage difference between the measurement Q-V curve and the reference Q-V curve by multiplying an inclination of the measurement Q-V curve by the voltage difference; or calculating a temporary maximum capacity after capacity deterioration caused by a change in the inclination of the measurement Q-V curve to an inclination of the reference Q-V curve by multiplying a ratio between the inclination of the measurement Q-V curve and the inclination of the reference Q-V curve by a reference maximum capacity.

According to one or more embodiments, a computer-readable recording medium stores therein diagnostic instructions that cause a computer to execute processing of calculating a value related to a capacity of a battery cell by using a function model approximating a Q-V curve indicating relation between a voltage and an integrated current amount of the battery cell, wherein processing of the calculating includes pieces of processing of: generating a function model fitted to a reference Q-V curve; fitting the function model that has been generated to measurement data of the battery cell; and calculating a maximum capacity of the battery cell by using a function model after fitting.

BRIEF DESCRIPTION OF THE DRAWINGS

FIG. 5 illustrates an example of a schematic configuration of a diagnostic device according to one or more embodiments;

DETAILED DESCRIPTION

Embodiments will be described below with reference to the drawings. The same elements are denoted by the same reference signs, and redundant description will be appropriately omitted.

INTRODUCTION

The disclosed technique relates to diagnosis of capacity deterioration of a storage battery such as a lithium-ion battery, more specifically, a battery cell and a storage battery system. The battery cell indicates the smallest unit of a storage battery that can be handled. The battery cell can also be simply referred to as a storage battery, and may be appropriately read as a storage battery as long as there is no contradiction. The storage battery system has a configuration in which a plurality of battery cells is connected in parallel or in series.

Figure 1:
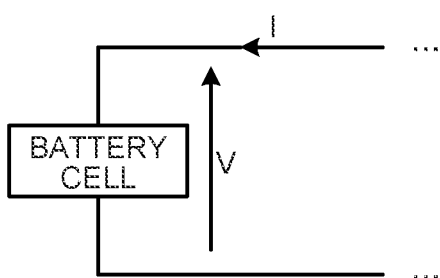
FIG. 1 schematically illustrates voltage and current of a battery cell.

FIG. 1 schematically illustrates voltage and current of a battery cell. The voltage of the battery cell is referred to as a battery voltage V, and illustrated. The current of the battery cell is referred to as a battery current I, and illustrated. The characteristics of the battery cell are represented by, for example, a Q-V curve (QV characteristics). The Q-V curve indicates the relation between the battery voltage V and an integrated current amount. The integrated current amount corresponds to a capacity (Q) according to coulomb counting, and the unit thereof is Ah.

Figure 2:
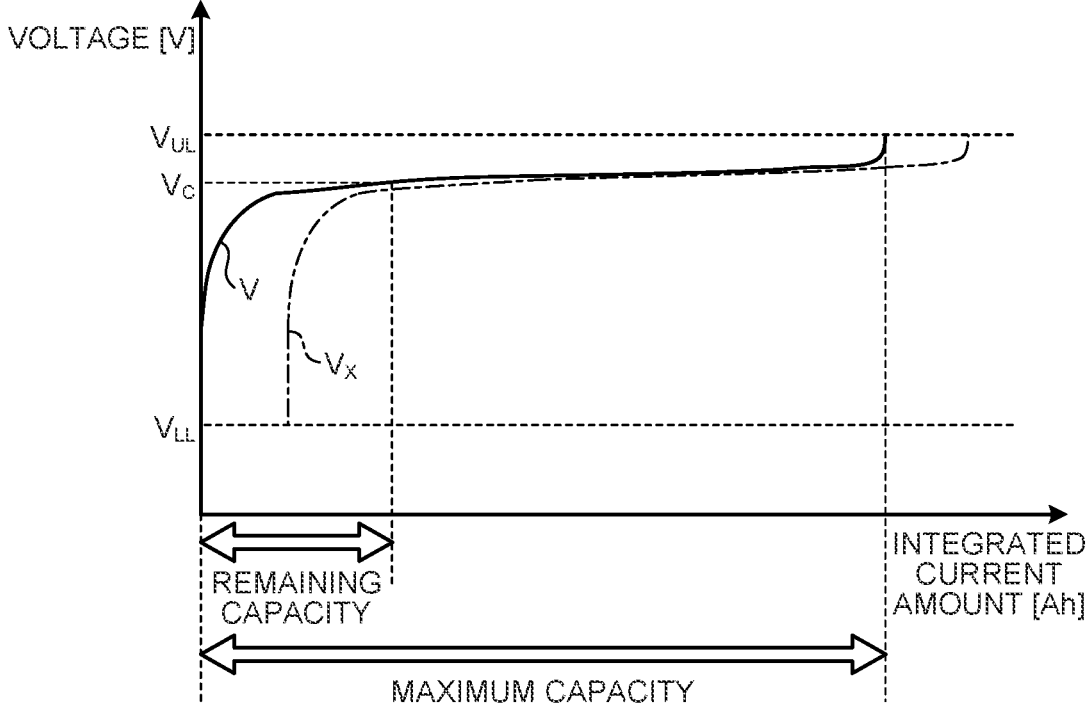
FIG. 2 illustrates an example of a Q-V curve.

FIG. 2 illustrates an example of the Q-V curve. The horizontal axis of the graph represents the integrated current amount (Ah), and the vertical axis represents the voltage (V). As indicated by a solid graph line, the battery voltage V changes in accordance with charging and discharging, that is, the integrated current amount. The battery cell is used at the battery voltage V within a determined range. The minimum voltage within the range is referred to as a lower limit voltage $V_{LL}$, and illustrated. The maximum voltage is referred to as an upper limit voltage $V_{UL}$, and illustrated.

When the battery voltage V is the lower limit voltage $V_{LL}$, the state of charge (SOC) of the battery cell is 0% (completely discharged state). When the battery voltage V is the upper limit voltage $V_{UL}$, the SOC is 100% (fully charged state). The maximum capacity of a battery cell DUT corresponds to an integrated current amount at the time when the battery cell is discharged from the upper limit voltage $V_{UL}$ to the lower limit voltage $V_{LL}$ or when the battery cell is charged from the lower limit voltage $V_{LL}$ to the upper limit voltage $V_{UL}$. The battery voltage V at any time point is referred to as a battery voltage $V_C$, and illustrated. The remaining capacity of the battery voltage $V_C$ corresponds to an integrated current amount at the time when the battery cell is charged from the lower limit voltage $V_{LL}$ to the battery voltage $V_C$ or when the battery cell is discharged from the battery voltage $V_C$ to the lower limit voltage $V_{LL}$.

Figure 3:
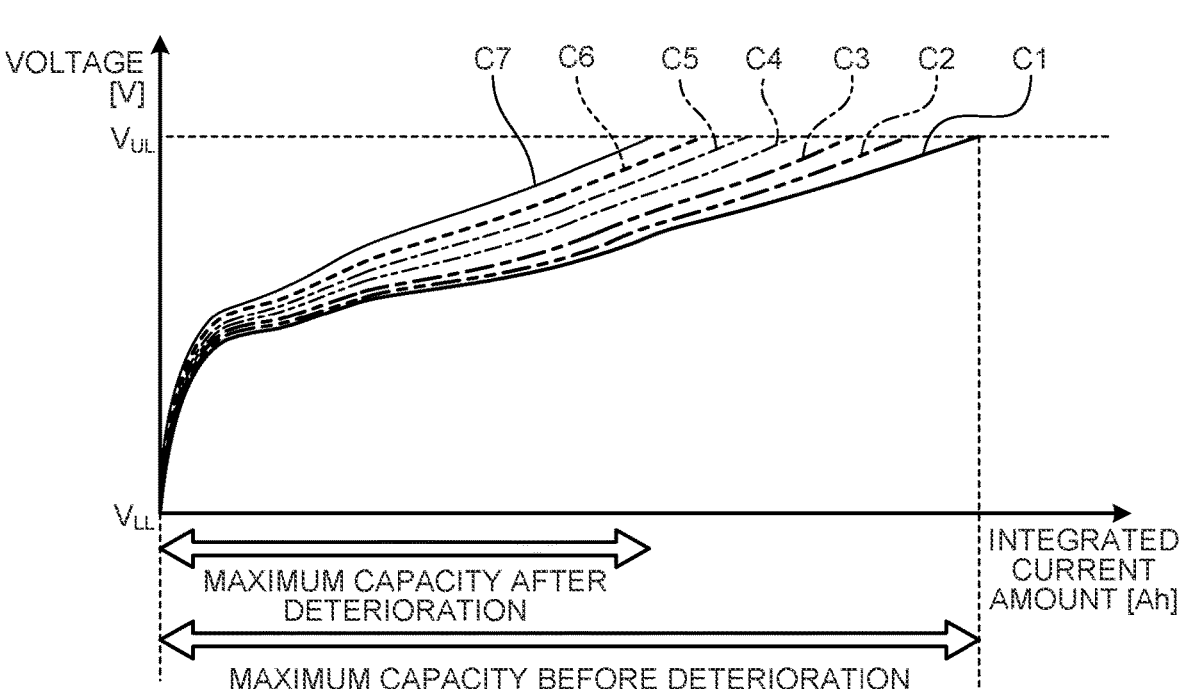
FIG. 3 illustrates an example of the relation between capacity deterioration and a Q-V curve.

FIG. 3 illustrates an example of the relation between capacity deterioration and a Q-V curve. Seven Q-V curves having different progress states of capacity deterioration are illustrated as graph lines C1 to C7. The capacity deterioration of battery cells progresses in the order of the graph lines C1 to C7. As is understood, capacity deterioration of a battery cell is caused by a decrease in the integrated current amount particularly at the time when the battery voltage V reaches the upper limit voltage $V_{UL}$. In comparison between the graph line C1 and the graph line C7, the maximum capacity in the graph line C1 corresponds to the maximum capacity before deterioration, and the maximum capacity in the graph line C7 corresponds to the maximum capacity after deterioration.

A differential curve of the Q-V curve also indicates the characteristics of the battery cell. The differential curve indicates a curve obtained by differentiating the integrated current amount with respect to the battery voltage V (dQ/dV) or a curve obtained by differentiating the battery voltage V with respect to the integrated current amount (dV/dQ).

Figure 4:
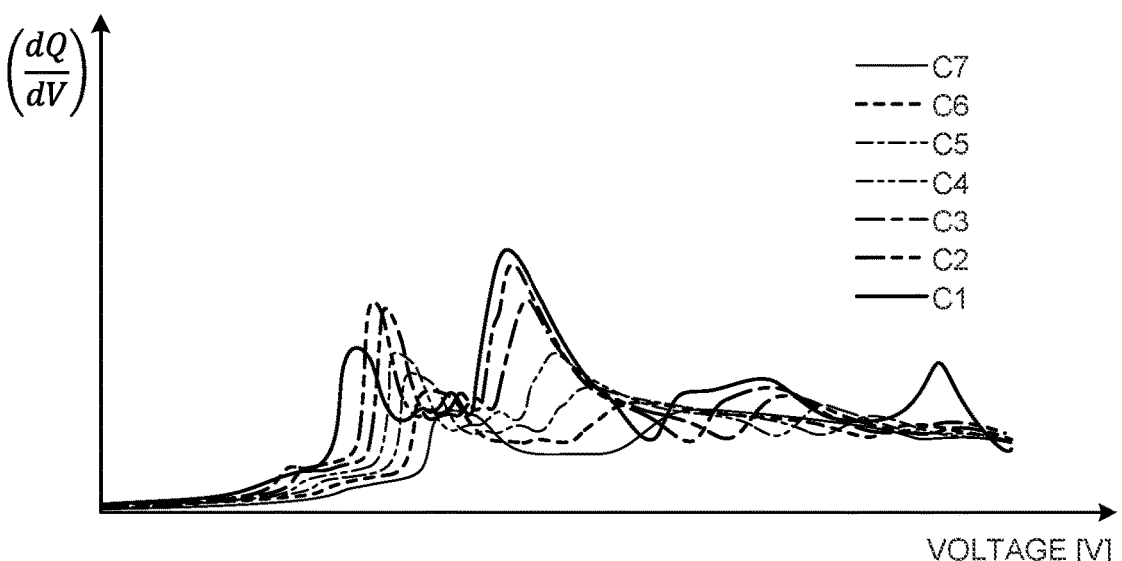
FIG. 4 illustrates an example of a differential curve.

FIG. 4 illustrates an example of the differential curve. In this example, the horizontal axis of the graph represents the voltage (V), and the vertical axis represents (dQ/dV). The graph lines C1 to C7 correspond to the differential curves of the above-described graph lines C1 to C7 in FIG. 3. The differential curves have some feature points. Examples of the feature points include extreme values (local maximum value and local minimum value). Hereinafter, unless otherwise specified, a feature point is a local maximum value that first appears in a differential curve within a use range of a battery cell.

When a battery cell is used for a long period of time, capacity is deteriorated, and a decrease in maximum capacity becomes obvious, so that the diagnosis of a capacity of the battery cell becomes necessary. The same applies to a storage battery system including a plurality of battery cells. For example, a storage battery system having a plurality of battery cells connected in series has no problem when the remaining capacity and the maximum capacity of the battery cells coincide with each other (balanced state). If the balanced state is lost, however, a useful capacity that can be used as a storage battery system, that is, a capacity of the entire storage battery system is reduced. For example, a storage battery system in which a battery cell of the battery voltage V represented by a solid graph line in FIG. 2 and a battery cell of a battery voltage $V_X$ represented by a dash dotted graph line are connected in series will be considered. The remaining capacities of two battery cells are different, and the balance is lost. The storage battery system is used such that the voltage of each of the two battery cells falls within a range of the lower limit voltage $V_{LL}$ to the upper limit voltage $V_{UL}$. In this case, the battery cell of the battery voltage V cannot be used up to the lower limit voltage $V_{LL}$, and the battery cell of the battery voltage $V_X$ cannot be used up to the upper limit voltage $V_{UL}$. The use ranges of the battery cells are narrowed, and the capacity of the entire storage battery system is reduced.

A storage battery has a difference in initial charging and discharging characteristics and characteristic change at the time of capacity deterioration depending on the constituent material. For example, a lithium-ion battery using an oxide of Ni—Mn—Co, which is referred to as a ternary system, as a positive electrode material has different charging and discharging characteristics depending on a compounding ratio of the three elements and a substance to be added. Furthermore, since the battery voltage V is output as a potential difference between a negative electrode and positive electrode characteristics, negative electrode characteristics also change the characteristics.

It takes enormous time to develop an algorithm for grasping battery cell characteristics corresponding to each constituent material of each manufacturer for battery cells having various characteristics depending on constituent materials as described above. According to the disclosed technology, diagnosis of a capacity of a battery cell with less material dependence is made possible. To put it by using a lithium-ion battery as an example, capacity deterioration of a battery cell is grasped from two factors. The two factors include: (1) deviation of a positive electrode potential and a negative electrode potential from an initial design value caused by deterioration derived from immobilization of Li in the negative electrode and the like due to charging and discharging operation and being left in a charged state; and (2) decrease in capacity of a deactivation factor due to immobilization of an active material and the like. Diagnosis that does not need full charging and discharging is also possible, which leads to reduction in diagnostic time. For example, diagnostic time can be shortened. Based on the diagnostic time, performance of a battery cell or a storage battery system is evaluated after the battery cell or the storage battery system is used in an electric vehicle, a hybrid vehicle, and the like, and determination of whether the battery cell or the storage battery system is to be reused or recycled for retrieving materials is made.

EXAMPLE

FIG. 5 illustrates an example of a schematic configuration of a diagnostic device according to one or more embodiments. A battery cell to be diagnosed by a diagnostic device 1 is referred to as a battery cell DUT and illustrated. In this example, the battery cell DUT is connected to a charging and discharging device 8. The charging and discharging device 8 charges and discharges the battery cell DUT at a desired charging and discharging rate, for example. According to a principle to be described later, charging and discharging only for a partial voltage range (range of integrated current amount and range of SOC) is sufficient.

The diagnostic device 1 includes a voltage detector 2, a current detector 3, a storage 4, a calculator 5, and an output unit 6. The voltage detector 2 detects the battery voltage V of a battery cell DUT. The voltage detector 2 acquires, for example, a measurement result of a voltmeter (not illustrated). The voltage detector 2 may include the voltmeter. The storage 4 stores the detection result of the voltage detector 2. The current detector 3 detects the battery current I of the battery cell DUT. The current detector 3 acquires, for example, a measurement result of an ammeter (not illustrated). The current detector 3 may include the ammeter. The storage 4 stores the detection result of the current detector 3.

The storage 4 stores various pieces of information necessary for processing executed in the diagnostic device 1. Examples of the stored information include reference data 41, measurement data 42, and a diagnostic program (diagnostic instructions) 43.

The reference data 41 serves as a standard (is to be compared) for capacity deterioration of a battery cell DUT, and includes, for example, data corresponding to the Q-V curve. The reference data 41 may be based on an actual measurement value of the battery cell DUT before progress of capacity deterioration, or may be based on a design value and a simulation value of the battery cell DUT. The reference data 41 may be measurement data at a predetermined temperature or charging and discharging rate.

The measurement data 42 corresponds to at least a part of the Q-V curve of the battery cell DUT. The measurement data 42 is based on the detection results of the voltage detector 2 and the current detector 3 described above. The measurement data 42 may be measurement data at substantially the same temperature or charging and discharging rate as those of the above-described reference data 41. Note that, for example, a temperature sensor (not illustrated) detects and grasps temperature. The integrated current amount in the Q-V curve of the battery cell DUT is obtained by integrating the battery current I detected by the current detector 3.

The diagnostic program 43 causes a computer to execute processing of the diagnostic device 1, for example, processing performed by the calculator 5 and the output unit 6 to be described later (e.g., calculation processing and output processing). At least a part of the functions of the diagnostic device 1 is implemented by operating a general-purpose computer in accordance with the diagnostic program 43, for example. The computer includes, for example, a communication device, a display device, a storage device, a memory, and a processor, which are connected to each other by a bus or the like. The processor reads the diagnostic program 43 from the storage device or the like, and develops the diagnostic program 43 in the memory, thereby causing the computer to function as the diagnostic device 1. Note that the diagnostic program 43 may be distributed via a network such as the Internet. The diagnostic program 43 may be recorded in a computer-readable recording medium such as a hard disk, a flexible disk (FD), a CD-ROM, a magneto-optical (MO) disk, and a digital versatile disc (DVD). Note that, of course, dedicated hardware that operates in accordance with the diagnostic program 43 may be used instead of the general-purpose computer.

The calculator 5 calculates a value related to the capacity of the battery cell DUT. In one or more embodiments, the calculator 5 calculates a value related to the capacity of the battery cell DUT based on a result of comparison between the Q-V curve obtained from the measurement data 42 and the Q-V curve obtained from the reference data 41. The Q-V curve obtained from the measurement data 42 is also referred to as a "measurement Q-V curve". The measurement Q-V curve can also be referred to as a Q-V curve after capacity deterioration. The Q-V curve obtained from the reference data 41 is also referred to as a "reference Q-V curve". The reference Q-V curve can also be referred to as a Q-V curve before capacity deterioration.

Figure 6:
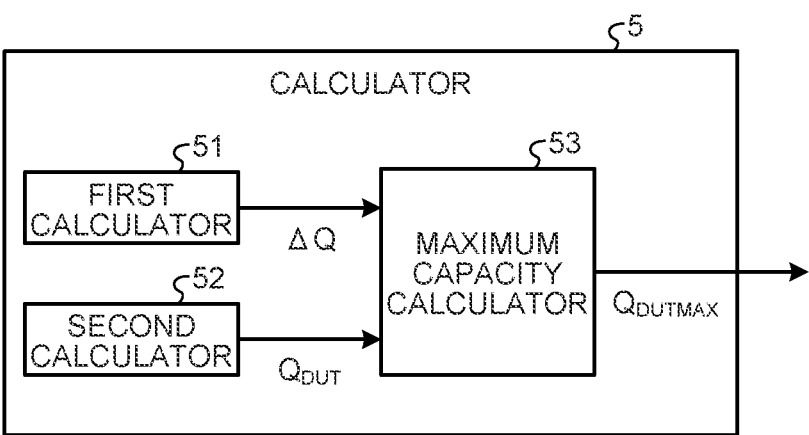
FIG. 6 illustrates an example of a schematic configuration of a calculator according to one or more embodiments.

FIG. 6 illustrates an example of a schematic configuration of the calculator. The calculator 5 includes, as functional blocks, a first calculator 51, a second calculator 52, and a maximum capacity calculator 53. A specific calculation method will be described with reference to FIGS. 7 and 8.

Figure 7:
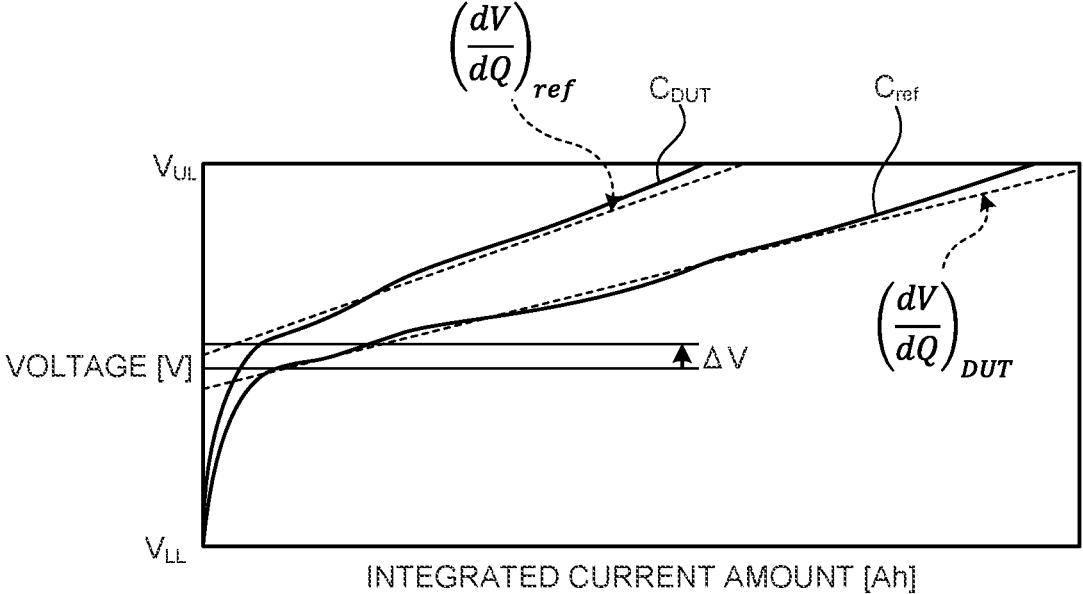
FIG. 7 illustrates an example of a reference Q-V curve and a measurement Q-V curve.

FIG. 7 illustrates an example of the reference Q-V curve and the measurement Q-V curve. A graph line $C_{ref}$ represents a reference Q-V curve. A graph line $C_{DUT}$ represents a measurement Q-V curve. The lower limit voltage $V_{LL}$ is, for example, approximately 2.8 V, and the upper limit voltage $V_{UL}$ is, for example, approximately 4.2 V. When the graph line $C_{ref}$ is compared with the graph line $C_{DUT}$, the factor of the capacity deterioration of a battery cell DUT can described by dividing the factor into two factors.

The first factor is a change in magnitude of the battery voltage V (shift of battery voltage V in vertical axis direction). The larger battery voltage V accelerates arrival to the upper limit voltage $V_{UL}$, and decreases the maximum capacity. For example, in a case of a lithium-ion battery, deviation of a positive electrode potential and a negative electrode potential from an initial design value appears as a shift of the battery voltage V. The deviation is generated by deterioration derived from immobilization of Li in the negative electrode and the like. The immobilization occurs due to charging and discharging operation of a battery cell and the battery cell being left in a charged state.

The second factor is a change in inclination of the battery voltage V. The larger inclination accelerates arrival to the upper limit voltage $V_{UL}$, and decreases the maximum capacity. A decrease in capacity of a deactivation factor due to immobilization of an active material and the like appears as a change in inclination of the battery voltage V. As also illustrated in FIG. 7, in a case of a battery cell using materials having a plurality of capacity holding potentials such as a ternary system in combination, the battery voltage V increases relatively monotonically as the integrated current amount increases. When the battery cell having such characteristics is deactivated or deteriorates in capacity due to partial destruction of an electrode structure, the degree of increase in the battery voltage V to the integrated current amount, that is, inclination increases. The battery voltage V greatly changes even with a small integrated current amount.

The first calculator 51 calculates a capacity deterioration amount caused by the above-described first factor (potential deviation between positive and negative electrodes), that is, the voltage difference between the measurement Q-V curve (graph line $C_{DUT}$) and the reference Q-V curve (graph line $C_{ref}$). The capacity deterioration amount is referred to as a "capacity deterioration amount $\Delta Q$". The voltage difference is referred to as a "voltage difference $\Delta V$". For example, the first calculator 51 calculates the difference between the voltages at feature points in the differential curves of the measurement Q-V curve and the reference Q-V curve as the voltage difference $\Delta V$.

Figure 8:
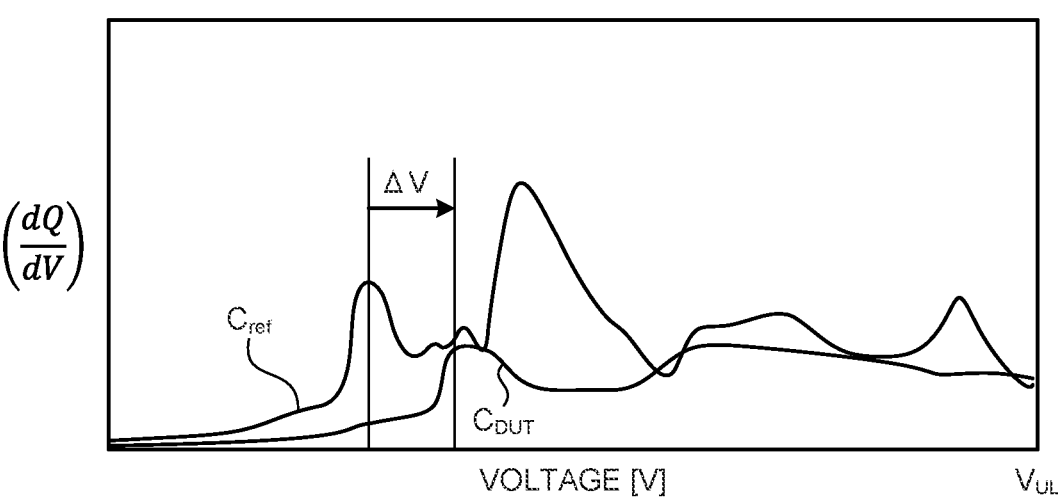
FIG. 8 illustrates an example of the differential curve.

FIG. 8 illustrates an example of the differential curve. The graph line $C_{ref}$ and the graph line $C_{DUT}$ correspond to the differential curves of the graph line $C_{ref}$ and the graph line $C_{DUT}$ in FIG. 7, respectively. In this example, the difference between the voltages of local maximum values that first appear in the two differential curves is calculated as the voltage difference $\Delta V$. Note that the local maximum value may be interpreted to include the maximum value.

The first calculator 51 calculates the capacity deterioration amount $\Delta Q$ caused by the voltage difference $\Delta V$ by multiplying the inclination of the Q-V curve, more specifically, the inclination of the integrated current amount to the battery voltage V (dQ/dV) by the voltage difference $\Delta V$. For example, Expression (1) below is used. The inclination (dQ/dV) used for the multiplication here may be an inclination in a case where the battery voltage V is equal to or greater than the voltage at a feature point. An inclination in a region near the upper limit voltage $V_{UL}$ may be used. For example, when the upper limit voltage $V_{UL}$ is 4.2 V and the voltage difference $\Delta V$ is 0.05 V, an average inclination from 4.15 V to 4.2 V may be used.

$$\Delta Q = \left(\frac{dQ}{dV}\right) \cdot \Delta V \tag{1}$$

The second calculator 52 calculates the maximum capacity after capacity deterioration caused by the above-described second factor (deactivation), that is, a change in inclination of the measurement Q-V curve to the inclination of the reference Q-V curve. The maximum capacity here is a temporary maximum capacity in consideration of only the second factor, and thus referred to as a "temporary maximum capacity $Q_{DUT}$".

Specifically, referring to FIG. 7 again, the second calculator 52 calculates the inclination (dV/dQ) of the battery voltage V to the integrated current amount for each of the reference Q-V curve (graph line $C_{ref}$) and the measurement Q-V curve (graph line $C_{DUT}$). The inclination calculated here may be an inclination in a case where the battery voltage V is equal to or greater than the voltage at a feature point. An inclination (dV/dQ) in a voltage range with a relatively high SOC (e.g., approximately 3.8 to 4.0 V) may be calculated. This is because, for example, when a negative electrode is made of graphite, a region (region also referred to as stage 1, stage 2, and the like) having excellent capacity holding capability of the negative electrode contributes to a high SOC side, and deactivation of a positive electrode active material is considered to be more visible in deterioration of the high SOC side.

In FIG. 7, a straight line having the calculated inclination of the reference Q-V curve (graph line $C_{ref}$) is indicated by a broken line as $(dV/dQ)_{ref}$. A straight line having the calculated inclination of the measurement Q-V curve (graph line $C_{DUT}$) is indicated by a broken line as $(dV/dQ)_{DUT}$.

The second calculator 52 calculates the temporary maximum capacity $Q_{DUT}$ by multiplying the ratio between the calculated inclination of the measurement Q-V curve and the calculated inclination of the reference Q-V curve by a reference maximum capacity $Q_{ref}$. For example, Expression (2) below is used. The reference maximum capacity $Q_{ref}$ is a maximum capacity obtained from the reference Q-V curve, and corresponds to the maximum capacity of the battery cell DUT before deterioration.

$$Q_{DUT} = \frac{\left(\frac{dV}{dQ}\right)_{ref}}{\left(\frac{dV}{dQ}\right)_{DUT}} \cdot Q_{ref} \tag{2}$$

The maximum capacity calculator 53 calculates a maximum capacity $Q_{DUTMAX}$ of the battery cell DUT by subtracting the capacity deterioration amount $\Delta Q$ calculated by the first calculator 51 from the temporary maximum capacity $Q_{DUT}$ calculated by the second calculator 52. For example, Expression (3) below is used. The maximum capacity $Q_{DUTMAX}$ calculated in this way is a maximum capacity in consideration of both the first factor (potential deviation between positive and negative electrodes) and the second factor (deactivation) described above.

$$Q_{DUTMAX} = Q_{DUT} - \Delta Q \tag{3}$$

A part of data of the Q-V curve of the battery cell DUT is sufficient for the acquired data 42 necessary for calculation performed by the first calculator 51, the second calculator 52, and the maximum capacity calculator 53. In the above-described example, measurement data in a voltage range near a feature point (e.g., 3.4 to 3.6 V) and a voltage range near the upper limit voltage $V_{UL}$ (e.g., 4.15 to 4.2 V) allows calculation of the capacity deterioration amount $\Delta Q$, the temporary maximum capacity $Q_{DUT}$, and the maximum capacity $Q_{DUTMAX}$. Diagnostic time can be reduced by not performing measurement in a range other than these ranges.

Returning to FIG. 5, the output unit 6 outputs the calculation result of the calculator 5 as a diagnostic result of the capacity of the battery cell DUT. Examples of the output include presentation (e.g., display) to a user and data transmission to an external server device (not illustrated). For example, the output unit 6 outputs the maximum capacity $Q_{DUTMAX}$ of the battery cell DUT calculated by the maximum capacity calculator 53. A decrease amount ($Q_{ref}-Q_{DUTMAX}$) from the reference maximum capacity $Q_{ref}$ may be output. A remaining capacity calculated from the battery voltage V of the battery cell DUT at the end of diagnosis may be output.

Furthermore, the output unit 6 may output the capacity deterioration amount $\Delta Q$ calculated by the first calculator 51 and the temporary maximum capacity $Q_{DUT}$ calculated by the second calculator 52. The capacity deterioration amount $\Delta Q$ may be displayed together with notice that the capacity deterioration amount $\Delta Q$ is caused by the first factor (potential deviation between positive and negative electrodes), for example. The temporary maximum capacity $Q_{DUT}$ may be displayed together with notice that the temporary maximum capacity $Q_{DUT}$ is a temporary capacity deterioration amount in consideration of only capacity deterioration caused by the second factor (deactivation). This contributes to grasping of a deterioration factor.

For example, as described above, the capacity of the battery cell DUT can be diagnosed. Note that, in some battery cells, the battery voltage V greatly increases at the end of charge. The above-described calculation method can be applied even to such a type of battery cell. This will be described with reference to FIGS. 9 and 10.

Figure 9:
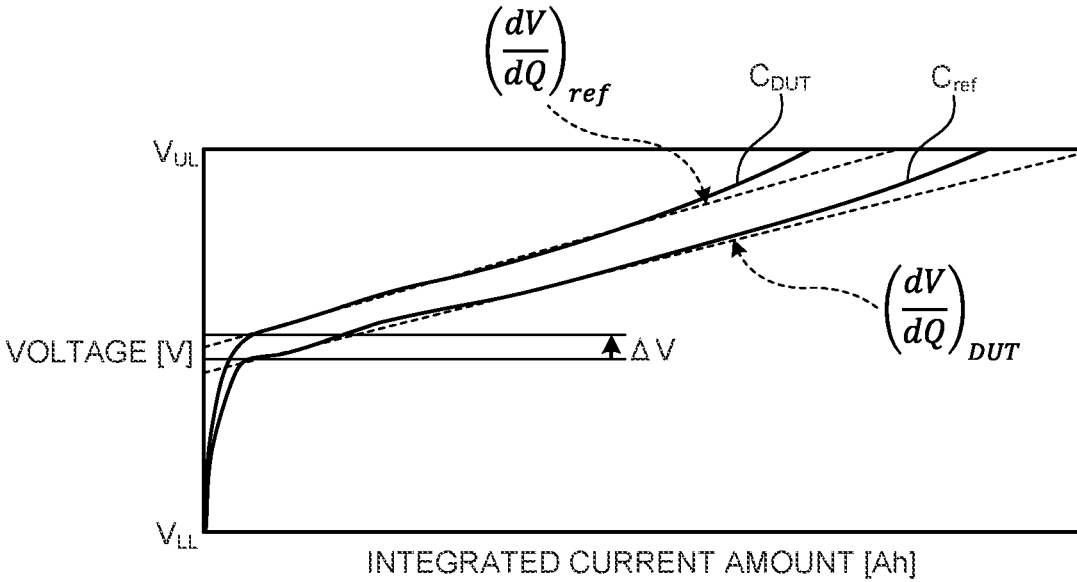
FIG. 9 illustrates an example of the reference Q-V curve and the measurement Q-V curve of another type of battery cell.
Figure 10:
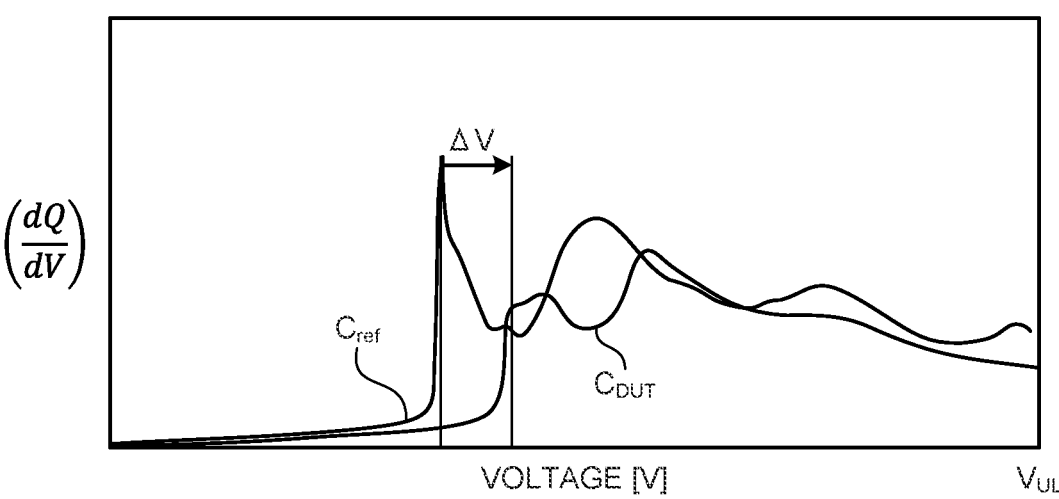
FIG. 10 illustrates an example of the differential curve.

FIG. 9 illustrates an example of a reference Q-V curve and a measurement Q-V curve of another type of battery cell. FIG. 10 illustrates an example of the differential curve. The battery voltage V greatly increases near the upper limit voltage $V_{UL}$, that is, at the end of charge. Also in this case, similarly to the method described so far, the capacity deterioration amount $\Delta Q$ can be calculated by multiplying the inclination of the integrated current amount to the battery voltage V (dQ/dV) by the voltage difference $\Delta V$. The temporary maximum capacity $Q_{DUT}$ can be calculated by multiplying the ratio between the inclination $(dV/dQ)_{DUT}$ of the measurement Q-V curve and the inclination $(dV/dQ)_{ref}$ of the reference Q-V curve by the reference maximum capacity $Q_{ref}$. The maximum capacity $Q_{DUTMAX}$ can also be calculated.

Note that, in the above description, an example in which the differential curve is the curve (dQ/dV) obtained by differentiating the integrated current amount with respect to the battery voltage V has been described. Note, however, that, as described above, the differential curve may be a curve (dV/dQ) obtained by differentiating the battery voltage V with respect to the integrated current amount.

Figure 11:
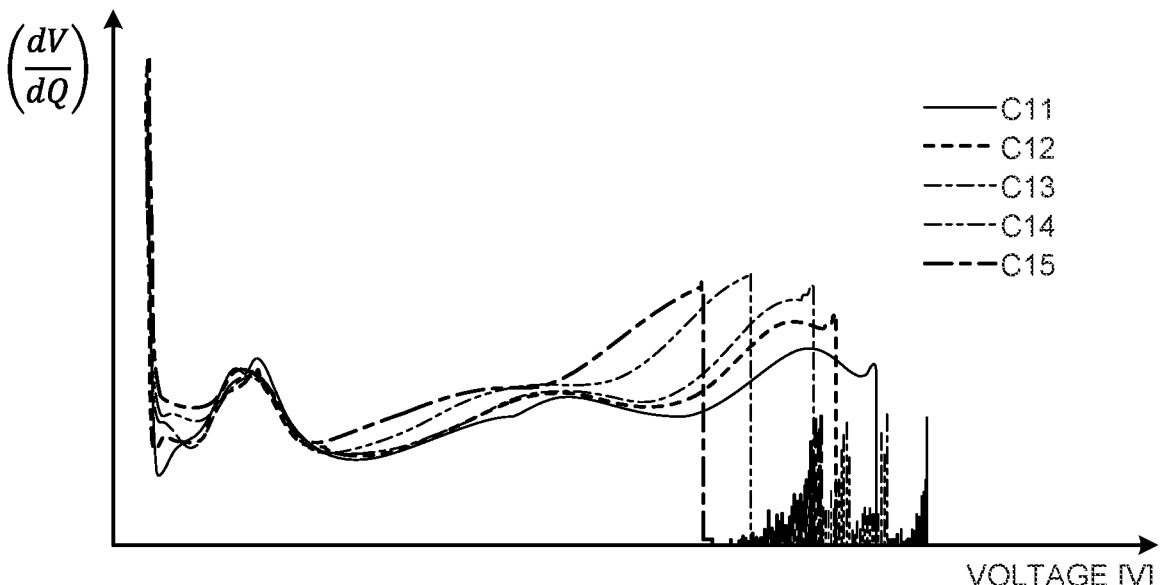
FIG. 11 illustrates another example of the differential curve.

FIG. 11 illustrates another example of the differential curve. The illustrated differential curve is a curve (dV/dQ) obtained by differentiating the battery voltage V with respect to the integrated current amount. Five differential curves having different progress states of capacity deterioration are illustrated as graph lines C11 to C15. The capacity deterioration of battery cells progresses in the order of the graph lines C11 to C15. Such differential curves also have feature points (e.g., local maximum value that appears first). Therefore, the voltage difference $\Delta V$ can be calculated.

Figure 12:
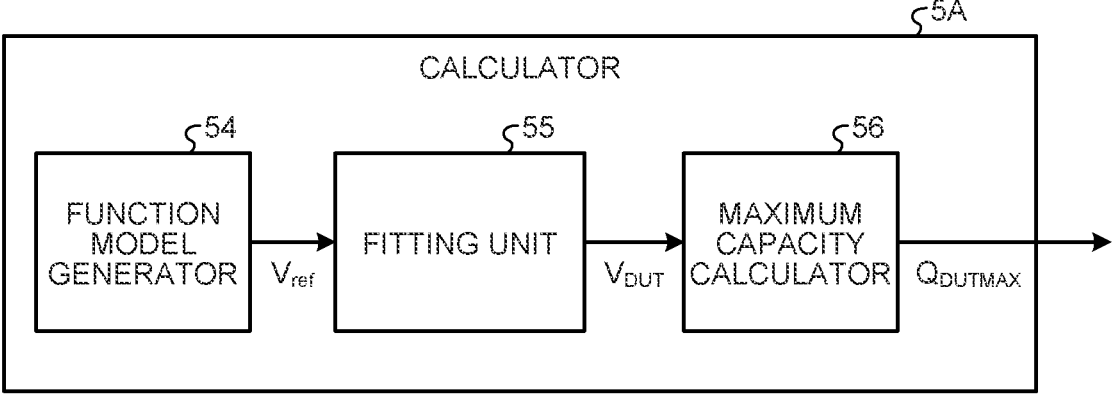
FIG. 12 illustrates another example of a schematic configuration of the calculator according to one or more embodiments.

A calculation method different from the above-described calculation method adopted by the calculator 5 will be described with reference to FIGS. 12 and 13. FIG. 12 illustrates another example of a schematic configuration of the calculator. The illustrated calculator 5A calculates a value related to the capacity of the battery cell DUT by using a function model approximating the Q-V curve of the battery cell DUT. The calculator 5A includes, as functional blocks therefor, a function model generator 54, a fitting unit 55, and a maximum capacity calculator 56.

Figure 13:
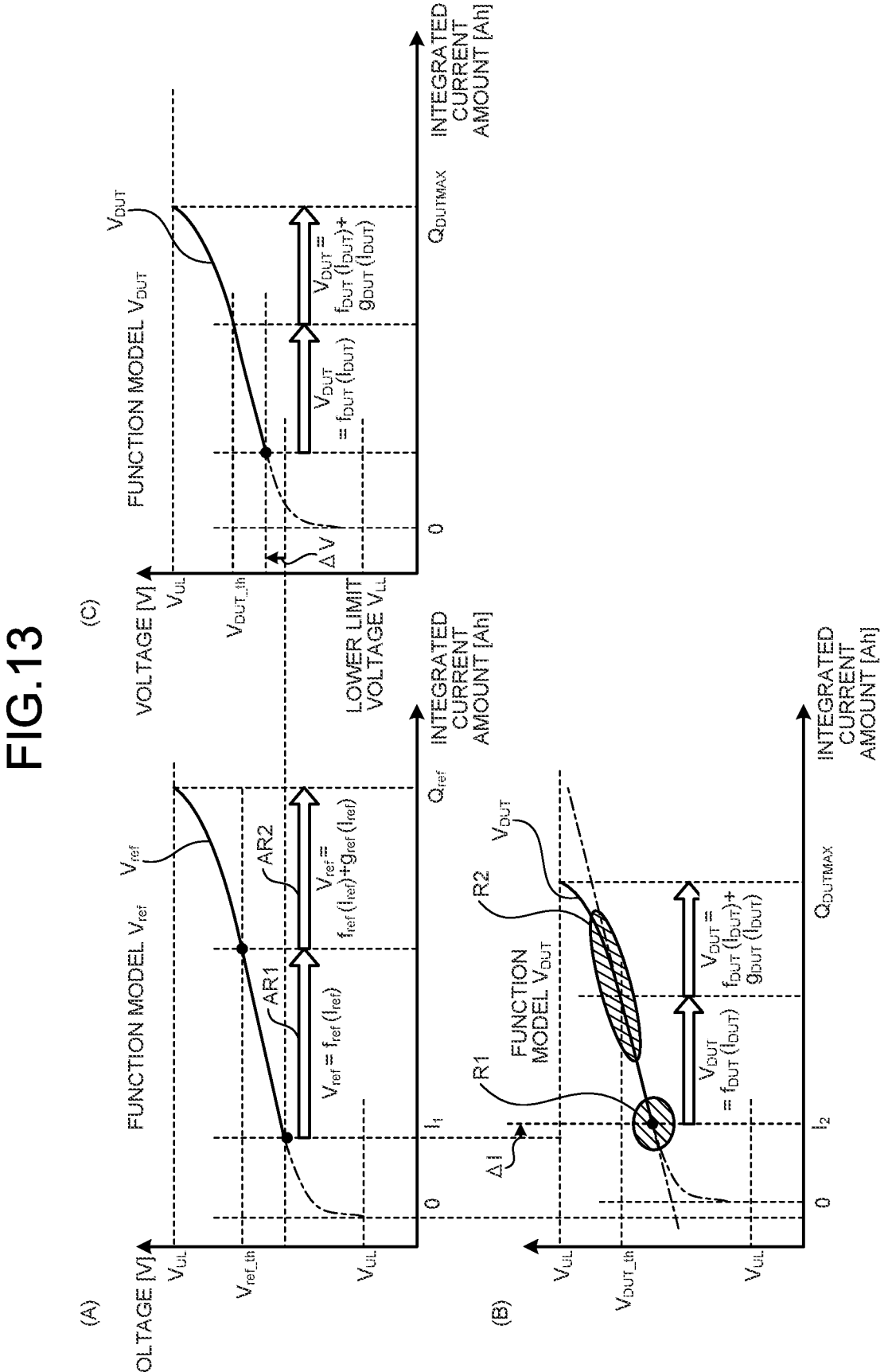
FIG. 13 illustrates another calculation method.

FIG. 13 illustrates the other calculation method. As illustrated in (A) of FIG. 13, the function model generator 54 generates a function model $V_{ref}$ fitted to the reference Q-V curve. The function model $V_{ref}$ may approximate a part of the reference Q-V curve. In this example, the function model $V_{ref}$ approximates a portion corresponding to a linear region indicated by an arrow AR1 and a non-linear region indicated by an arrow AR2 in the reference Q-V curve. Note that a graph line of a region outside an approximation range is indicated by a dash dotted line. In the linear region, the battery voltage V may substantially linearly change to the integrated current amount. The linear region may have a voltage equal to or greater than the voltage at a feature point. In the non-linear region, the battery voltage V non-linearly changes to the integrated current amount. The non-linear region is located on a high voltage side (high SOC side) than the linear region. The battery voltage V at the boundary between the linear region and the non-linear region is referred to as a threshold voltage $V_{ref\_th}$, and illustrated. The function model $V_{ref}$ can also be said as a function model at a voltage equal to or greater than the voltage at the feature point (threshold voltage $V_{ref\_th}$).

The illustrated function model $V_{ref}$ is determined so as to satisfy $V_{ref}=f_{ref}(I_{ref})$ in the linear region and $V_{ref}=f_{ref}(I_{ref})+g_{ref}(I_{ref})$ in the non-linear region. $I_{ref}$ is an integrated current amount in the graph of (A) of FIG. 13. The function $f_{ref}(I_{ref})$ is, for example, a linear function having the integrated current amount $I_{ref}$ as a variable. The function $g_{ref}(I_{ref})$ is, for example, an exponential function or a multi-order function having the integrated current amount $I_{ref}$ as a variable. Parameters (e.g., coefficients) of the function $f_{ref}(I_{ref})$ and the function $g_{ref}(I_{ref})$ are adjusted so as to approximate a corresponding portion of the reference Q-V curve (graph line $C_{ref}$). A common method such as a least squares method may be adopted for the approximation adjustment.

The fitting unit 55 fits the function model $V_{ref}$ generated by the function model generator 54 to the measurement data 42. A parameter of the function model $V_{ref}$ is adjusted so as to approximate the measurement data 42. (B) and (C) of FIG. 13 illustrate the function model $V_{ref}$ after fitting as a function model $V_{DUT}$. The function model $V_{DUT}$ approximates the Q-V curve of the battery cell$_{DUT}$. Note that a graph line of a region outside an approximation range is indicated by a dash dotted line. The graph of (B) of FIG. 13 is drawn at a position where the relation between the horizontal axes with the graph of (A) of FIG. 13 is easily grasped. The graph of (C) of FIG. 13 is drawn at a position where the relation between the vertical axes with the graph of (A) of FIG. 13 is easily grasped. The battery voltage V at the boundary between the linear region and the non-linear region in the function model $V_{DUT}$ is referred to as a threshold voltage $V_{DUT\_th}$, and illustrated. The function model $V_{DUT}$ can also be said as a function model at a voltage equal to or greater than the threshold voltage $V_{DUT\_th}$.

In this example, the function model $V_{DUT}$ is represented by using a function $f_{DUT}(I_{DUT})$ and a function $g_{DUT}(I_{DUT})$. $I_{DUT}$ is an integrated current amount in the graphs of (B) and (C) of FIG. 13. The function $f_{DUT}(I_{DUT})$ is obtained by adjusting a parameter of the above-described function $f_{ref}$ ($I_{ref}$) The function $g_{DUT}(I_{DUT})$ is obtained by adjusting a parameter of the above-described function $g_{ref}(I_{ref})$.

A part of data of the Q-V curve of the battery cell DUT is sufficient for the measurement data 42 necessary for fitting performed by the fitting unit 55. (B) of FIG. 13 illustrates a range R1 and a range R2 as the range of the necessary measurement data 42. The range R1 includes a feature point and the surrounding thereof. The range R2 includes the boundary between the linear region and the non-linear region and the surrounding thereof. Measurement data in these ranges R1 and R2 allows fitting of a function $f_{DUT}(I_C)$ and a function $g_{DUT}(I_C)$ corresponding to the linear region and the non-linear region.

The maximum capacity calculator 56 calculates the maximum capacity $Q_{DUTMAX}$ of the battery cell DUT by using the function model $V_{ref}$ after fitting performed by the fitting unit 55, that is, the function model $V_{DUT}$. An integrated current amount $I_C$ in which the battery voltage V indicated by the function model $V_{DUT}$ is the upper limit voltage $V_{UL}$ can be the maximum capacity to be obtained. Note, however, that, as understood from (A) and (C) of FIG. 13, the horizontal axis of the function model $V_{ref}$ does not coincide with the horizontal axis of the function model $V_{DUT}$. The maximum capacity $Q_{DUTMAX}$ can be calculated by correcting the deviation between the horizontal axes (by aligning horizontal axes).

Here, since a remaining capacity (Ah) at a feature point in a low SOC region is the first reaction accompanying battery energy absorption at the time of charge, it is approximated (assumed) that a battery cell before progress of capacity deterioration and the battery cell after the progress have the same amount. In this case, the position of the feature point in the differential curve of the function model $V_{DUT}$ is required to be aligned with the position of the feature point in the differential curve of the function model $V_{ref}$.

The integrated current amount at a feature point of the function model $V_{ref}$ is referred to as an integrated current amount $I_1$ and illustrated. The integrated current amount $I_1$ is calculated as an integrated current amount corresponding to the voltage at a feature point of the differential curve (dQ/dV) calculated from the measurement data in the range R1 of the reference data 41, for example. The integrated current amount at a feature point of the function model $V_{DUT}$ is referred to as an integrated current amount 12 and illustrated. The integrated current amount 12 is calculated as an integrated current amount corresponding to the voltage at a feature point in the differential curve (dQ/dV) calculated from the measurement data in the range R1 of the measurement data 42, for example. When a difference between the horizontal axis of the function model $V_{ref}$ and the horizontal axis of the function model $V_{DUT}$ is defined as $\Delta I$, $\Delta I = I_2 - I_1$ is established. The horizontal axis can be corrected by subtracting $\Delta I$ from the integrated current amount $I_{DUT}$ in the function model $V_{DUT}$.

The calculation performed by the maximum capacity calculator 56 includes correction to align the positions of feature points in the differential curves of the function model $V_{ref}$ and the function model $V_{DUT}$. Specifically, the maximum capacity calculator 56 calculates the integrated current amount $I_{DUT}$ in which the function model $V_{DUT}$ in the non-linear region, that is, $f_{DUT}(I_{DUT}) + g_{DUT}(I_{DUT})$ is equal to the upper limit voltage $V_{UL}$, and further calculates a value $(I_{DUT} - \Delta I)$ corrected by $\Delta I$ as the maximum capacity $Q_{DUTMAX}$. As a result, an appropriate maximum capacity in consideration of the deviation between the horizontal axes is calculated.

The maximum capacity calculator 56 may calculate various values related to the capacity by using not only the maximum capacity $Q_{DUTMAX}$ but the function model $V_{DUT}$ and a differential curve thereof. For example, since the voltage difference $\Delta V$ can be calculated as illustrated in (C) of FIG. 13, the capacity deterioration amount $\Delta Q$ caused by the first factor (potential deviation between positive and negative electrodes) can be calculated. The temporary maximum capacity $Q_{DUT}$ after capacity deterioration caused by the second factor (deactivation) can also be calculated. Similarly to the calculation result of the calculator 5 described above, the output unit 6 may output the calculation result of the calculator 5A.

An example in which the capacity of the battery cell DUT connected to the charging and discharging device 8 is diagnosed has been described above. In this case, it is necessary to suspend the use of the battery cell DUT to be diagnosed. From a more practical viewpoint, it is desirable to enable diagnosis of the capacity of a battery cell DUT (during operation) incorporated in and used in a storage battery system.

It is difficult to actually measure the maximum capacity in a common storage battery system for various reasons. For example, an actual storage battery system is not used in a range of an SOC of 0 to 100% in order to have a margin or extend a life. A storage battery system always used for system stabilization and the like has difficulty in having a period for full charging and discharging. In order to perform full charging and discharging, it takes two hours at a charging and discharging rate of 1 C, and 10 hours at a charging and discharging rate of 0.2 C. In a storage battery system having a plurality of battery cells connected in series, each battery cell cannot be fully charged and discharged if the balance of the battery cell is lost, and thus the maximum capacity of each battery cell cannot be actually measured.

From the above, in an actual storage battery system, the maximum capacity is displayed by the following methods. For example, there is a method of statistically reducing the maximum capacity in accordance with conditions such as an operating time and the number of charging and discharging cycles. In the method, unfortunately, the displayed maximum capacity does not coincide with the actual maximum capacity when an unexpected battery cell is used. There is a method of preliminarily setting the maximum capacity with a margin. In the method, unfortunately, a battery cell is not effectively used. Although a method of periodically performing full charging and discharging and actually measuring and reflecting the maximum capacity may be used, the storage battery system may fail to be used. Factors of a decrease in effective capacity due to variations of individual battery cells cannot be considered.

Figure 14:
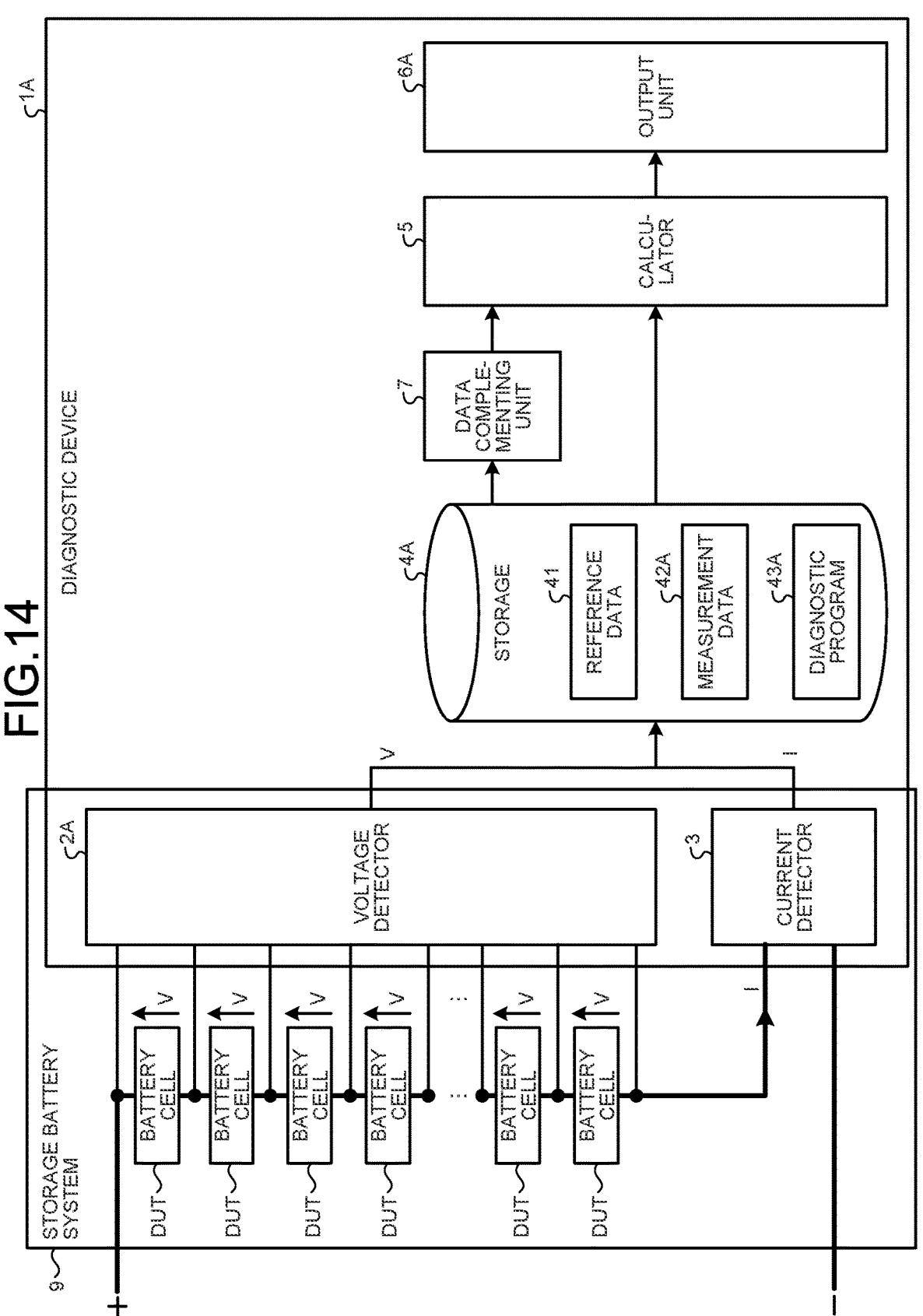
FIG. 14 illustrates an example of a schematic configuration of the diagnostic device according to one or more embodiments.

FIG. 14 illustrates an example of a schematic configuration of the diagnostic device. The illustrated diagnostic device 1A diagnoses the capacity of the storage battery system 9 by diagnosing the capacities of a plurality of battery cells DUT in the storage battery system 9. In this example, the storage battery system 9 includes a plurality of battery cells DUT connected in series. The storage battery system 9 is also referred to as an assembled battery, an energy storage system (ESS), or the like. The storage battery system 9 can also include a voltage detector 2A and the current detector 3.

The diagnostic device 1A includes the voltage detector 2A, the current detector 3, a storage 4A, the calculator 5, an output unit 6A, and a complementing unit 7. When the voltage detector 2A and the current detector 3 are components of the storage battery system 9 and the diagnostic device 1A uses the voltage detector 2A and the current detector 3, the diagnostic device 1A itself does not need to include the voltage detector 2A and the current detector 3. Note that the calculator 5 may be the calculator 5A.

The voltage detector 2A detects the battery voltage V of each of the plurality of battery cells DUT. The current detector 3 detects the battery current I. Since the battery cells DUT are connected in series, the battery current I is common to the battery cells DUT. The battery voltage V and the battery current I detected by the voltage detector 2A and the current detector 3 are the battery voltage V and the battery current I during operation.

The storage 4A stores various pieces of information necessary for processing executed in the diagnostic device 1A. Examples of the stored information include the reference data 41, measurement data 42A, and a diagnostic program 43A. Since the reference data 41 is as described above, the description thereof will not be repeated. The measurement data 42A relates to the QV characteristics of each of a plurality of battery cells DUT, for example, corresponds to at least a part of the Q-V curve. The diagnostic program 43A causes a computer to execute processing of the diagnostic device 1A.

First, the complementing unit 7 will be described. The complementing unit 7 complements the measurement data 42A, as necessary. Since the measurement data 42A is limited to the detection results of the battery voltage V and the battery current I during operation, measurement data necessary for calculation performed by the calculator 5 may be insufficient. In such a case, the complementing unit 7 performs complementation. Although a method of complementation is not particularly limited, for example, linear interpolation and complementation using a multi-order expression may be used. Note that the measurement data 42A complemented by the complementing unit 7 is also continuously referred to as the measurement data 42A.

The calculator 5 calculates a value related to the capacity of each of the plurality of battery cells DUT by using the reference data 41 and the measurement data 42A stored in the storage 4A. The same applies to the calculator 5A. Since details have been described above, the description will not be repeated.

The output unit 6A outputs (e.g., displays) the calculation result of the calculator 5 (or calculator 5A) as a diagnostic result of the capacity of the storage battery system 9. For example, the output unit 6A outputs the maximum capacity of the entire plurality of battery cells DUT, that is, the capacity of the storage battery system 9, or outputs the balanced state of each of the battery cells DUT in the storage battery system 9. Similarly to the above-described output unit 6 (FIG. 5), the output unit 6A can output the maximum capacity $Q_{DUTMAX}$, a capacity decrease amount $(Q_{ref}-Q_{DUTMAX})$, a remaining capacity, the capacity deterioration amount $\Delta Q$, and the like of each of the battery cells DUT.

Some embodiments of the disclosed technique have been described above. The disclosed technique is not limited to the above-described embodiments. For example, in the above-described embodiments, an example in which the calculator 5 (FIGS. 5 and 6) includes three functional blocks of the first calculator 51, the second calculator 52, and the maximum capacity calculator 53 has been described. Note, however, that the calculator 5 is not required to include all of these functional blocks. For example, the calculator 5 is only required to include at least one of the first calculator 51 or the second calculator 52. Only the calculation of the capacity deterioration amount $\Delta Q$ with the first calculator 51 leads to the diagnosis of the capacity of a battery cell. Only the calculation of the temporary maximum capacity $Q_{DUT}$ with the second calculator 52 leads to the diagnosis of the capacity of a battery cell.

In the above description, embodiments have been described mainly from the form of a device such as the diagnostic device 1 and the aspect of a program (instructions) such as a diagnostic program 43. Note, however, that various pieces of processing, that is, a diagnostic method achieved by a device and a program (instructions) is also one or more embodiments.

The above-described technique is specified as follows, for example. One disclosed technique is a diagnostic device. As described with reference to FIGS. 5 to 11 and the like, the diagnostic device 1 calculates a value related to the capacity of a battery cell DUT based on a result of comparison between the measurement Q-V curve and the reference Q-V curve. The measurement Q-V curve indicates the relation between a voltage (battery voltage V) and an integrated current amount, which are acquired from the measurement data 42 of the battery cell DUT. The calculator 5 includes at least one of the first calculator 51 or the second calculator 52. The first calculator 51 calculates the capacity deterioration amount $\Delta Q$ caused by the voltage difference $\Delta V$ by multiplying the inclination (dQ/dV) of the measurement Q-V curve by the voltage difference $\Delta V$ between the measurement Q-V curve and the reference Q-V curve. The second calculator 52 calculates the temporary maximum capacity $Q_{DUT}$ after capacity deterioration caused by a change in inclination of the measurement Q-V curve to the inclination of the reference Q-V curve by multiplying the ratio between the inclination $(dV/dQ)_{DUT}$ of the measurement Q-V curve and the inclination $(dV/dQ)_{ref}$ of the reference Q-V curve by the reference maximum capacity $Q_{ref}$.

According to the above-described diagnostic device 1, the capacity of a battery cell DUT can be diagnosed from the Q-V curve. For example, capacity deterioration caused by potential deviation between positive and negative electrodes (first factor) can be diagnosed by calculating the capacity deterioration amount $\Delta Q$. Capacity deterioration caused by deactivation (second factor) can be diagnosed by calculating the temporary maximum capacity $Q_{DUT}$. Such a calculation method is not an algorithm specialized for each type of material but an algorithm that can be generally applied in a battery cell having different initial charging and discharging characteristics and characteristic changes at the time of capacity deterioration depending on the constituent material. An algorithm for grasping battery cell characteristics corresponding to each constituent material of each battery manufacturer can be developed in a short period of time, and a development budget therefor can also be reduced.

In addition, as described above with reference to FIGS. 7 and 8, a part of data of the Q-V curve of the battery cell DUT is sufficient for the measurement data 42 necessary for calculation, so that the diagnostic time can be reduced. For example, diagnostic time can be shortened. Based on the diagnostic time, performance of a battery cell or a storage battery system is evaluated after the battery cell or the storage battery system is used in an electric vehicle, a hybrid vehicle, and the like, and determination of whether the battery cell or the storage battery system is to be reused or recycled for retrieving materials is made.

The calculator 5 may include the maximum capacity calculator 53 that calculates a maximum capacity $Q_{DUTMAX}$ of the battery cell DUT by subtracting the capacity deterioration amount $\Delta Q$ calculated by the first calculator 51 from the temporary maximum capacity $Q_{DUT}$ calculated by the second calculator 52. In this way, the maximum capacity $Q_{DUTMAX}$ can be appropriately calculated in consideration of the two factors of potential deviation between positive and negative electrodes and deactivation. That is, the maximum capacity of the battery cell DUT can be appropriately diagnosed.

The voltage difference $\Delta V$ may be a voltage difference between the feature points in the differential curves of the measurement Q-V curve and the reference Q-V curve. For example, in such a way, the voltage difference $\Delta V$ can be calculated.

A feature point is a local maximum value that first appears in a differential curve. The above-described inclination may be an inclination at a voltage equal to or greater than the voltage of a feature point. For example, the capacity deterioration amount $\Delta Q$, the temporary maximum capacity $Q_{DUT}$, and the maximum capacity $Q_{DUTMAX}$ can be calculated based on such a feature point and an inclination.

As described with reference to FIGS. 12 and 13 and the like, in another calculation method, the calculator 5A calculates a value related to the capacity of the battery cell DUT by using the function model $V_{DUT}$ that approximates the Q-V curve. The calculator 5A includes the function model generator 54, the fitting unit 55, and the maximum capacity calculator 56. The function model generator 54 generates a function model $V_{ref}$ fitted to the reference Q-V curve. The fitting unit 55 fits the function model $V_{ref}$ generated by the function model generator 54 to the measurement data 42 of the battery cell DUT. The maximum capacity calculator 56 calculates the maximum capacity $Q_{DUTMAX}$ of the battery cell DUT by using the function model $V_{DUT}$ after fitting performed by the fitting unit 55. The calculator 5A also achieves effects similar to the above-described effects of the calculator 5.

The calculation performed by the maximum capacity calculator 56 may include aligning the positions of feature points in the differential curves of the function model $V_{ref}$ and the function model $V_{DUT}$ before and after fitting performed by the fitting unit 55. After the axes of the function model $V_{ref}$ and the function model $V_{DUT}$ coincide with each other, an appropriate maximum capacity $Q_{DUTMAX}$ can be calculated.

A feature point is a local maximum value that first appears in a differential curve. The function model $V_{ref}$ and the function model $V_{DUT}$ may be function models at a voltage equal to or greater than the voltage of the feature point. For example, the maximum capacity $Q_{DUTMAX}$ can be calculated based on such a feature point and function model.

A method of diagnosing a battery cell and a storage battery system with the diagnostic device 1 is also one of the disclosed techniques. The diagnostic method includes calculating a value related to the capacity of a battery cell DUT based on a result of comparison between the measurement Q-V curve and the reference Q-V curve. The measurement Q-V curve indicates the relation between a voltage (battery voltage V) and an integrated current amount, which are acquired from the measurement data 42 of the battery cell DUT. The calculating includes at least one of: calculating the capacity deterioration amount $\Delta Q$ caused by the voltage difference $\Delta V$ by multiplying the inclination (dQ/dV) of the measurement Q-V curve by the voltage difference $\Delta V$ between the measurement Q-V curve and the reference Q-V curve; or calculating the temporary maximum capacity $Q_{DUT}$ after capacity deterioration caused by a change in inclination of the measurement Q-V curve to the inclination of the reference Q-V curve by multiplying the ratio between the inclination $(dV/dQ)_{DUT}$ of the measurement Q-V curve and the inclination $(dV/dQ)_{ref}$ of the reference Q-V curve by the reference maximum capacity $Q_{ref}$. Effects similar to those of the above-described diagnostic device 1 are obtained.

A method of diagnosing a battery cell and a storage battery system with the diagnostic device 1A is also one of the disclosed techniques. The diagnostic method includes calculating a value related to the capacity of a battery cell DUT by using a function model $V_{DUT}$ that approximates the Q-V curve indicating the relation between the voltage (battery voltage V) and the integrated current amount of the battery cell DUT. The calculating includes: generating the function model $V_{ref}$ fitted to the reference Q-V curve; fitting the generated function model $V_{ref}$ to the measurement data 42 of the battery cell DUT; and calculating the maximum capacity $Q_{DUTMAX}$ of the battery cell DUT by using the function model $V_{DUT}$ after fitting. Effects similar to those of the above-described diagnostic device 1A are obtained.

The diagnostic program 43 described with reference to FIG. 5 and the like is also one of the disclosed techniques. The diagnostic program 43 causes a computer to execute processing of calculating a value related to the capacity of a battery cell DUT based on a result of comparison between the measurement Q-V curve and the reference Q-V curve. The measurement Q-V curve indicates the relation between a voltage (battery voltage V) and an integrated current amount, which are acquired from the measurement data 42 of the battery cell DUT. The calculating processing includes at least one of pieces of processing of: calculating the capacity deterioration amount $\Delta Q$ caused by the voltage difference $\Delta V$ by multiplying the inclination (dQ/dV) of the measurement Q-V curve by the voltage difference $\Delta V$ between the measurement Q-V curve and the reference Q-V curve; or calculating the temporary maximum capacity $Q_{DUT}$ after capacity deterioration caused by a change in inclination of the measurement Q-V curve to the inclination of the reference Q-V curve by multiplying the ratio between the inclination $(dV/dQ)_{DUT}$ of the measurement Q-V curve and the inclination $(dV/dQ)_{ref}$ of the reference Q-V curve by the reference maximum capacity $Q_{ref}$. Alternatively, the diagnostic program 43 causes a computer to execute processing of calculating a value related to the capacity of a battery cell DUT by using a function model $V_{DUT}$ that approximates the Q-V curve indicating the relation between the voltage (battery voltage V) and the integrated current amount of the battery cell DUT. The calculating processing includes pieces of processing of: generating the function model $V_{ref}$ fitted to the reference Q-V curve; fitting the generated function model $V_{ref}$ to the measurement data 42 of the battery cell DUT; and calculating the maximum capacity $Q_{DUTMAX}$ of the battery cell DUT by using the function model $V_{DUT}$ after fitting. Effects similar to those of the above-described diagnostic device 1 or those of the diagnostic device 1A are obtained.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A diagnostic device comprising:
   a voltage detector that detects voltage of a battery cell;
   a current detector that detects current of the battery cell;
   a storage that stores reference data and measurement data including the detected voltage and the detected current; and
   calculators that:
      acquire:
         a measurement Q-V curve indicating a relation between a voltage and an integrated current amount that are obtained from the measurement data, and
         a reference Q-V curve obtained from the reference data,
      include:
         a first calculator that calculates an amount of capacity deterioration caused by a voltage difference between the measurement Q-V curve and the reference Q-V curve by multiplying an inclination of the measurement Q-V curve by the voltage difference;
         a second calculator that calculates a temporary maximum capacity after capacity deterioration caused by a change in the inclination of the measurement Q-V curve to an inclination of the reference Q-V curve by multiplying a ratio between the inclination of the measurement Q-V curve and the inclination of the reference Q-V curve by a reference maximum capacity; and
         a maximum capacity calculator that calculates a maximum capacity of the battery cell by subtracting the calculated amount of capacity deterioration from the calculated temporary maximum capacity, and
      causes a display to display the calculated maximum capacity.

2. The diagnostic device according to claim 1, wherein the voltage difference is a voltage difference between a feature point of a differential curve of the measurement Q-V curve and another feature point of another differential curve of the reference Q-V curve.

3. The diagnostic device according to claim 2, wherein
   the feature point is a local maximum value that first appears in the differential curve,
   the another feature point is a local maximum value that first appears in the another differential curve,
   the inclination of the measurement Q-V curve is an inclination at a voltage equal to or greater than a voltage of the feature point, and
   the inclination of the reference Q-V curve is an inclination at a voltage equal to or greater than a voltage of the another feature point.

4. The diagnostic device according to claim 1, wherein
   the calculators further:
      generate a function model fitted to the reference Q-V curve,
      fit the generated function model to the measurement data of the battery cell, and
      calculate the maximum capacity of the battery cell based on the function model after the fitting.

5. The diagnostic device according to claim 4, wherein the calculators align a position of a feature point in a differential curve of the function model before the fitting with another position of another feature point in another differential curve of the function model after the fitting.

6. The diagnostic device according to claim 5, wherein
   the feature point is a local maximum value that first appears in the differential curve,
   the another feature point is a local maximum value that first appears in the another differential curve,
   the function model before fitting is a function model at a voltage equal to or greater than a voltage of the feature point, and
   the function model after fitting is a function model at a voltage equal to or greater than a voltage of the another feature point.

7. A diagnostic method comprising:
   detecting, with a voltage detector, voltage of a battery cell;
   detecting, with a current detector, current of the battery cell;
   storing reference data and measurement data including the detected voltage and the detected current in a storage;
   acquiring:
      a measurement Q-V curve indicating a relation between a voltage and an integrated current amount that are obtained from the measurement data, and
      a reference Q-V curve obtained from the reference data;
   calculating, with a first calculator, an amount of capacity deterioration caused by a voltage difference between the measurement Q-V curve and the reference Q-V curve by multiplying an inclination of the measurement Q-V curve by the voltage difference;
   calculating, with a second calculator, a temporary maximum capacity after capacity deterioration caused by a change in the inclination of the measurement Q-V curve to an inclination of the reference Q-V curve by multiplying a ratio between the inclination of the measurement Q-V curve and the inclination of the reference Q-V curve by a reference maximum capacity;
   calculating, with a maximum capacity calculator, a maximum capacity of the battery cell by subtracting the calculated amount of capacity deterioration from the calculated temporary maximum capacity; and
   causing a display to display the calculated maximum capacity.

8. The diagnostic method according to claim 7 further comprising:
   generating a function model fitted to the reference Q-V curve;
   fitting the generated function model to the measurement data of the battery cell; and
   calculating the maximum capacity of the battery cell based on the function model after the fitting.

9. A non-transitory computer-readable recording medium having stored therein diagnostic instructions that cause a computer to execute:
   detecting, with a voltage detector, voltage of a battery cell;
   detecting, with a current detector, current of the battery cell;
   storing reference data and measurement data including the detected voltage and the detected current in a storage;
   acquiring:
      a measurement Q-V curve indicating a relation between a voltage and an integrated current amount that are obtained from the measurement data, and
      a reference Q-V curve obtained from the reference data;

calculating, with a first calculator, an amount of capacity deterioration caused by a voltage difference between the measurement Q-V curve and the reference Q-V curve by multiplying an inclination of the measurement Q-V curve by the voltage difference;

calculating, with a second calculator, a temporary maximum capacity after capacity deterioration caused by a change in the inclination of the measurement Q-V curve to an inclination of the reference Q-V curve by multiplying a ratio between the inclination of the measurement Q-V curve and the inclination of the reference Q-V curve by a reference maximum capacity;

calculating, with a maximum capacity calculator, a maximum capacity of the battery cell by subtracting the calculated amount of capacity deterioration from the calculated temporary maximum capacity; and causing a display to display the calculated maximum capacity.

10. The non-transitory computer-readable recording medium according to claim 9, wherein the diagnostic instructions that further cause the computer to execute:

generating a function model fitted to the reference Q-V curve;

fitting the generated function model to the measurement data of the battery cell; and calculating the maximum capacity of the battery cell based on the function model after the fitting.

\* \* \* \* \*